United States Patent [19]

Sardella

[11] Patent Number: 5,310,622
[45] Date of Patent: May 10, 1994

[54] METHOD OF PATTERNING A REFLECTIVE SURFACE IN AN INTEGRATED CIRCUIT

[75] Inventor: John C. Sardella, Highland Village, Tex.

[73] Assignee: SGS-Thomson Microelectronics, Inc., Carrollton, Tex.

[21] Appl. No.: 890,696

[22] Filed: May 29, 1992

[51] Int. Cl.$^5$ ............................ G03C 5/16; G03F 7/26
[52] U.S. Cl. .................................. 430/313; 436/311; 436/318; 436/319; 436/329; 156/643; 156/660; 156/661.1
[58] Field of Search ............... 430/311, 312, 313, 318, 430/319, 329, 333; 156/643, 654, 659.1, 660, 661.1

[56] References Cited

U.S. PATENT DOCUMENTS

| | | | |
|---|---|---|---|
| 4,362,809 | 12/1982 | Chen | 430/312 |
| 4,770,739 | 9/1988 | Orvek | 430/318 |
| 4,906,552 | 3/1990 | Ngo | 430/312 |
| 5,091,289 | 2/1992 | Cronin | 430/312 |

*Primary Examiner*—Marion E. McCamish
*Assistant Examiner*—Kathleen Duda
*Attorney, Agent, or Firm*—Kenneth C. Hill; Lisa K. Jorgenson; Richard K. Robinson

[57] ABSTRACT

A method for patterning a reflective surface in an integrated circuit. A first photoresist layer is formed over a conductive layer in the integrated circuit. A second photoresist layer is then formed over the first photoresist layer, where the transmittance of the first photoresist layer is less than the transmittance of the second photoresist layer. The first and second photoresist layers are exposed to define a masking pattern, and portions of the first and second masking layers are then removed to form a mask which corresponds to the masking pattern. Finally, the conductive layer is patterned using the mask formed by the first and second photoresist layers.

19 Claims, 1 Drawing Sheet

METHOD OF PATTERNING A REFLECTIVE SURFACE IN AN INTEGRATED CIRCUIT

BACKGROUND OF THE INVENTION

1. Field of the Invention

The present invention relates generally to the fabrication of integrated circuits, and more particularly to a method for patterning a reflective surface in an integrated circuit.

2. Description of the Prior Art

Proper signal line patterning is important to the operation of an integrated circuit. Reflections off the surface of a metal layer during exposure of an overlying photoresist layer, however, can subsequently cause problems with the formation of the signal line.

Reflection problems are intensified on integrated circuits having hills and valleys on the surface. The sidewalls of the steps reflect the heat, light or radiation at various angles into the photoresist, resulting in poor image resolution. Poor image resolution is especially undesirable in complex integrated circuits, due to the importance of maintaining critical dimensions. Furthermore, those skilled in the art will recognize that notching, or a thinning of the signal line, typically occurs as a result of the reflections. Notching is especially a problem when the patterned signal line crosses a step. As known in the art, notching can lead to electromigration and other device failure mechanisms.

Techniques which have been used to solve reflection problems include the use of an anti-reflective coating on the surface of the metal layer, or on the bottom or the top of the photoresist layer. These techniques, however, are not completely successful in integrated circuits having a varied topography. As known in the art, the photoresist layer is thicker in the valleys on the surface of the integrated circuit. Therefore, it is necessary to overexpose the photoresist in order to allow the radiation to reach the photoresist located at the bottom of the valleys. This overexposure, however, can increase the amount of reflections from the metal layer.

Therefore, it would be desirable to provide a method for patterning reflective surfaces in integrated circuits which reduces the reflections into a photoresist layer. It is also desirable that such a method not significantly increase the complexity of the fabrication process.

SUMMARY OF THE INVENTION

A method is provided for patterning a reflective surface in an integrated circuit. A first photoresist layer is formed over a conductive layer in the integrated circuit. A second photoresist layer is then formed over the first photoresist layer, where the transmittance of the first photoresist layer is less than the transmittance of the second photoresist layer. The first and second photoresist layers are exposed to define a masking pattern, and portions of the first and second masking layers are then removed to form a mask which corresponds to the masking pattern. Finally, the conductive layer is patterned using the mask formed by the first and second photoresist layers.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
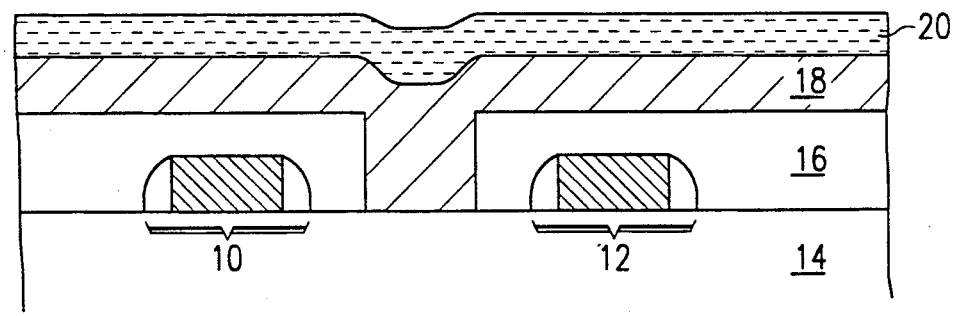
FIGS. 1-4 are cross sectional views of an integrated circuit illustrating a preferred method for patterning a reflective surface in an integrated circuit.

FIGS. 1-4 are cross sectional views of an integrated circuit illustrating a preferred method for patterning a reflective surface in an integrated circuit. Referring to FIG. 1, conductive elements 10, 12 are formed on an underlying region 14 in an integrated circuit. The underlying region 14 can be either a semiconductor substrate or another conductive structure.

An insulating layer 16 is then formed over the integrated circuit. The insulating layer 16 can be made of, for example, oxide or spin on glass. Next, an opening is created through the insulating layer 16 to expose a portion of the underlying region 14. A conductive layer 18 is then deposited over the integrated circuit and extends into the opening to make electrical contact with a portion of the underlying region 14. In the preferred embodiment, the conductive layer 18 is made of a material which has a reflective surface, such as a metal. A first photoresist layer 20 is then deposited over the conductive layer 18.

Figure 2:
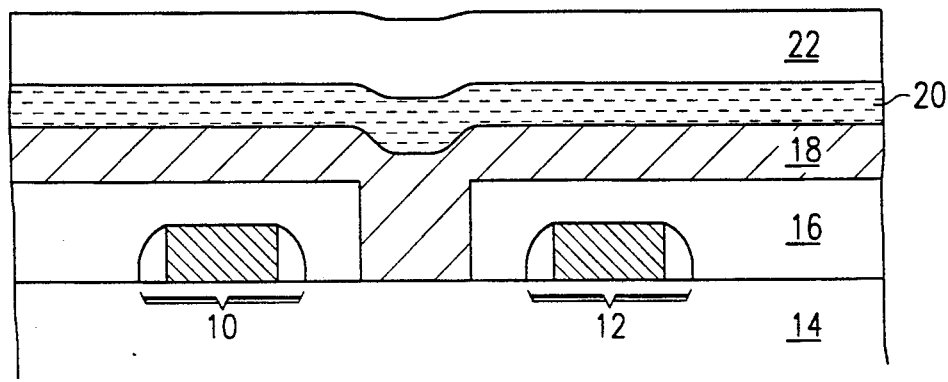

FIG. 2 illustrates the integrated circuit after a second photoresist layer 22 is deposited over the first photoresist layer 20. In the preferred embodiment, the first photoresist layer 20 has a thickness of approximately 2250 angstroms and the second photoresist layer 22 has a thickness of approximately 16,400 angstroms. Furthermore, the transmittance of the first photoresist layer 20 is less than the transmittance of the second photoresist layer 22.

For example, the first photoresist layer 20 is dyed and the second photoresist layer 22 is either not dyed or lightly dyed. If the second photoresist layer 22 is lightly dyed, it is preferable that the first photoresist layer 20 contain two to three times more dye than the second photoresist layer 22.

Figure 3:
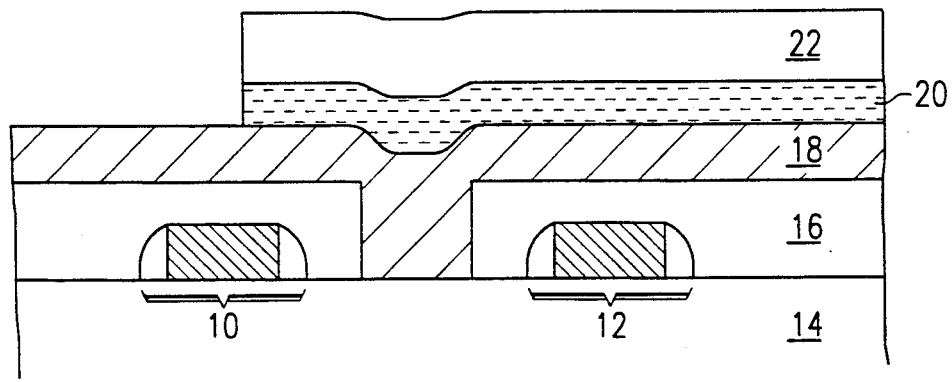

Referring to FIG. 3, the first 20 and second 22 photoresist layers are exposed to radiation, and portions of the first 20 and second 22 photoresist layers are then removed to define a masking pattern. The term radiation includes such photolithography methods as visible or ultraviolet light, x-ray, or electron beam. Those skilled in the art will recognize that if the first 20 and second 22 photoresist layers are negative resists, the unexposed portions of the first 20 and second 22 photoresist layers are removed, and if the first 20 and second 22 photoresist layers are positive resists, the exposed portions of the first 20 and second 22 photoresist layers are removed.

Because the second photoresist layer 22 is clear or lightly dyed, and the first photoresist layer 20 is a thin more heavily dyed photoresist, the total amount of radiation needed to expose the first 20 and second 22 photoresist layers is less than if one dyed photoresist layer is utilized. This is due to the fact that the second photoresist layer 22 is clear or lightly dyed and is therefore easily exposed, and the first photoresist layer 20 is thin enough to be easily exposed and removed, thereby eliminating the need to overexpose the first 20 and second 22 photoresist layers. This feature reduces the amount of reflections from the conductive layer 18. Finally, because the first photoresist layer 20 is darker than the second photoresist layer 22, the first photoresist layer 20 absorbs any reflections from the surface of the conductive layer 18 during exposure of the first 20 and second 22 photoresist layers. By absorbing the reflections from the surface of the conductive layer 18, the image resolution of the masking pattern is greatly improved.

Figure 4:
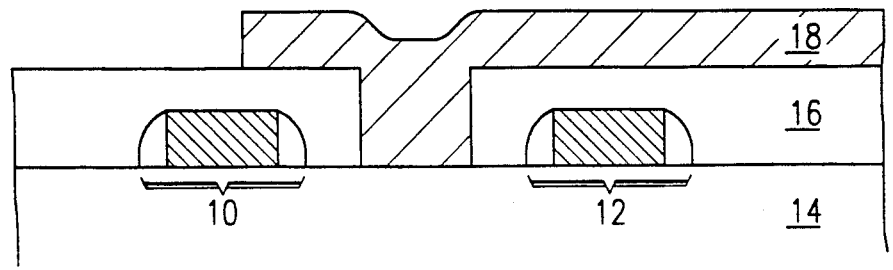

FIG. 4 illustrates the integrated circuit after the conductive layer 18 is patterned and the first 20 and second 22 photoresist layers are removed. The integrated circuit is now ready for further processing.

While the invention has been particularly shown and described with reference to a preferred embodiment, it will be understood by those skilled in the art that various changes in form and detail may be made therein without departing from the spirit and scope of the invention.

What is claimed is:

1. A method for fabricating an integrated circuit structure, comprising the steps of:
    forming a first photoresist layer over a conductive layer on the integrated circuit;
    forming a second photoresist layer over the first photoresist layer, wherein the transmittance of the first photoresist layer is less than the transmittance of the second photoresist layer;
    simultaneously exposing the first and second photoresist layers to define a masking pattern;
    removing portions of the first and second photoresist layers to leave remaining portions forming a mask corresponding to the masking pattern; and
    patterning the conductive layer utilizing the mask formed by the first and second photoresist layers.

2. The method of claim 1, further comprising the step of removing the remaining portions of the first and second photoresist layers.

3. The method of claim 1, wherein said step of forming the first photoresist layer comprises depositing a layer of dyed photoresist over the conductive layer.

4. The method of claim 3, wherein said conductive layer comprises a metal.

5. The method of claim 1, wherein the transmittance of the first and second photoresist layers is determined by a concentration of dye in each layer, and wherein the first photoresist layer has a higher dye concentration than the second photoresist layer.

6. The method of claim 5, wherein the dyed first photoresist layer comprises a photoresist having two to three times the dye concentration of the second photoresist layer.

7. The method of claim 1, wherein said step of forming the second photoresist layer comprises depositing a layer of undyed photoresist over the first photoresist layer.

8. The method of claim 1, wherein said step of removing portions of the first and second photoresist layers comprises removing the exposed portions of the first and second photoresist layers.

9. The method of claim 1, wherein said step of removing portions of the first and second photoresist layers comprises removing the unexposed portions of the first and second photoresist layers.

10. A method for fabricating an integrated circuit, comprising the steps of:
    forming a conductive structure on an underlying substrate region in the integrated circuit;
    forming an insulating layer over the integrated circuit;
    forming a conductive layer over the insulating layer;
    forming a first photoresist layer over a conductive layer on the integrated circuit;
    forming a second photoresist layer over the first photoresist layer, wherein the transmittance of the second photoresist layer is greater than the transmittance of the first photoresist layer;
    simultaneously exposing the first and second photoresist layers to define a masking pattern;
    removing portions of the first and second photoresist layers to leave remaining portions forming a mask corresponding to the masking pattern; and
    patterning the conductive layer utilizing the mask formed by the first and second photoresist layers.

11. The method of claim 10, further comprising the step of forming an opening through the insulating layer to expose a portion of the conductive structure, wherein the conductive layer extends into the opening to make electrical contact with the conductive structure.

12. The method of claim 10, further comprising the step of removing the remaining portions of the first and second photoresist layers.

13. The method of claim 10, wherein said step of forming the first photoresist layer comprises depositing a layer of dyed photoresist over the conductive layer.

14. The method of claim 13, wherein said conductive layer comprises a metal.

15. The method of claim 10, wherein the transmittance of the first and second photoresist layers is determined by a concentration of dye in each layer, and wherein the first photoresist layer has a higher dye concentration than the second photoresist layer.

16. The method of claim 15, wherein the dyed first photoresist layer comprises a photoresist having two to three times the dye concentration of the second photoresist layer.

17. The method of claim 10, wherein said step of forming the second photoresist layer comprises depositing a layer of undyed photoresist over the first photoresist layer.

18. The method of claim 10, wherein said step of removing portions of the first and second photoresist layers comprises removing the exposed portions of the first and second photoresist layers.

19. The method of claim 10, wherein said step of removing portions of the first and second photoresist layers comprises removing the unexposed portions of the first and second photoresist layers.

* * * * *